(12) United States Patent
Mokhtar et al.

(10) Patent No.: US 11,784,146 B1
(45) Date of Patent: Oct. 10, 2023

(54) METHOD AND APPARATUS FOR A GROUND WIRE BONDING ATTACHMENT IN MMIC DEVICES

(71) Applicant: Scientific Components Corporation, Brooklyn, NY (US)

(72) Inventors: Fuad Haji Mokhtar, Kedah (MY); Goh Chee Kheng, Pulau Pinang (MY); Khor Gang Quan, Pulau Pinang (MY); Alvin Yong Shee Meng, Pulau Pinang (MY)

(73) Assignee: Scientific Components Corporation, Brooklyn, NY (US)

(*) Notice: Subject to any disclaimer, the term of this patent is extended or adjusted under 35 U.S.C. 154(b) by 310 days.

(21) Appl. No.: 17/221,983

(22) Filed: Apr. 5, 2021

Related U.S. Application Data

(60) Provisional application No. 63/006,416, filed on Apr. 7, 2020.

(51) Int. Cl.
| | |
|---|---|
| *H01L 23/66* | (2006.01) |
| *H01L 23/00* | (2006.01) |
| *H01L 23/498* | (2006.01) |
| *H01L 21/48* | (2006.01) |

(52) U.S. Cl.
CPC .......... *H01L 23/66* (2013.01); *H01L 21/4853* (2013.01); *H01L 23/49838* (2013.01); *H01L 24/48* (2013.01); *H01L 2223/6611* (2013.01); *H01L 2223/6683* (2013.01); *H01L 2224/48227* (2013.01)

(58) Field of Classification Search
CPC .......................... H01L 23/66; H01L 21/4853
See application file for complete search history.

(56) References Cited

U.S. PATENT DOCUMENTS

| | | | | |
|---|---|---|---|---|
| 2008/0136552 | A1* | 6/2008 | Kim | ............... H01P 5/08 333/32 |
| 2020/0395331 | A1* | 12/2020 | Muto | ............... H01L 24/85 |

\* cited by examiner

*Primary Examiner* — Errol V Fernandes
(74) *Attorney, Agent, or Firm* — Lawrence G. Fridman, ESQ; FEIGIN & FRIDMAN, LLC

(57) ABSTRACT

An apparatus and method for co-axial wire bonding to improve impedance and electrical package connection performance of a substrate attached to the interior of an electrical device package. One or more wire bonds making ground connections between a package and an internal electrical circuit substrate make a non-contact geometrical crossing over an active electrical signal wire.

20 Claims, 14 Drawing Sheets

METHOD AND APPARATUS FOR A GROUND WIRE BONDING ATTACHMENT IN MMIC DEVICES

CROSS-REFERENCE TO RELATED APPLICATIONS

This application claims the benefit of U.S. Provisional Application Ser. No. 63/006,416 filed by the applicants on Apr. 7, 2020, which is incorporated in its entirety herein by reference.

FIELD OF THE INVENTION

The present invention relates generally to packaged electronic devices, and in particular, to packaged monolithic microwave integrated circuit (MMIC) devices.

BACKGROUND OF THE INVENTION

Attachment from conductive inputs and/or outputs of a monolithic microwave integrated circuit (MMIC) package to a MMIC device may be made by conductive wire bonds. Such attachments may be exposed and may exhibit a parasitic electrical inductance and/or an energy radiation loss. There remains a need for a device and technique to reduce such parasitic effects and/or radiation losses.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

Figure 1:
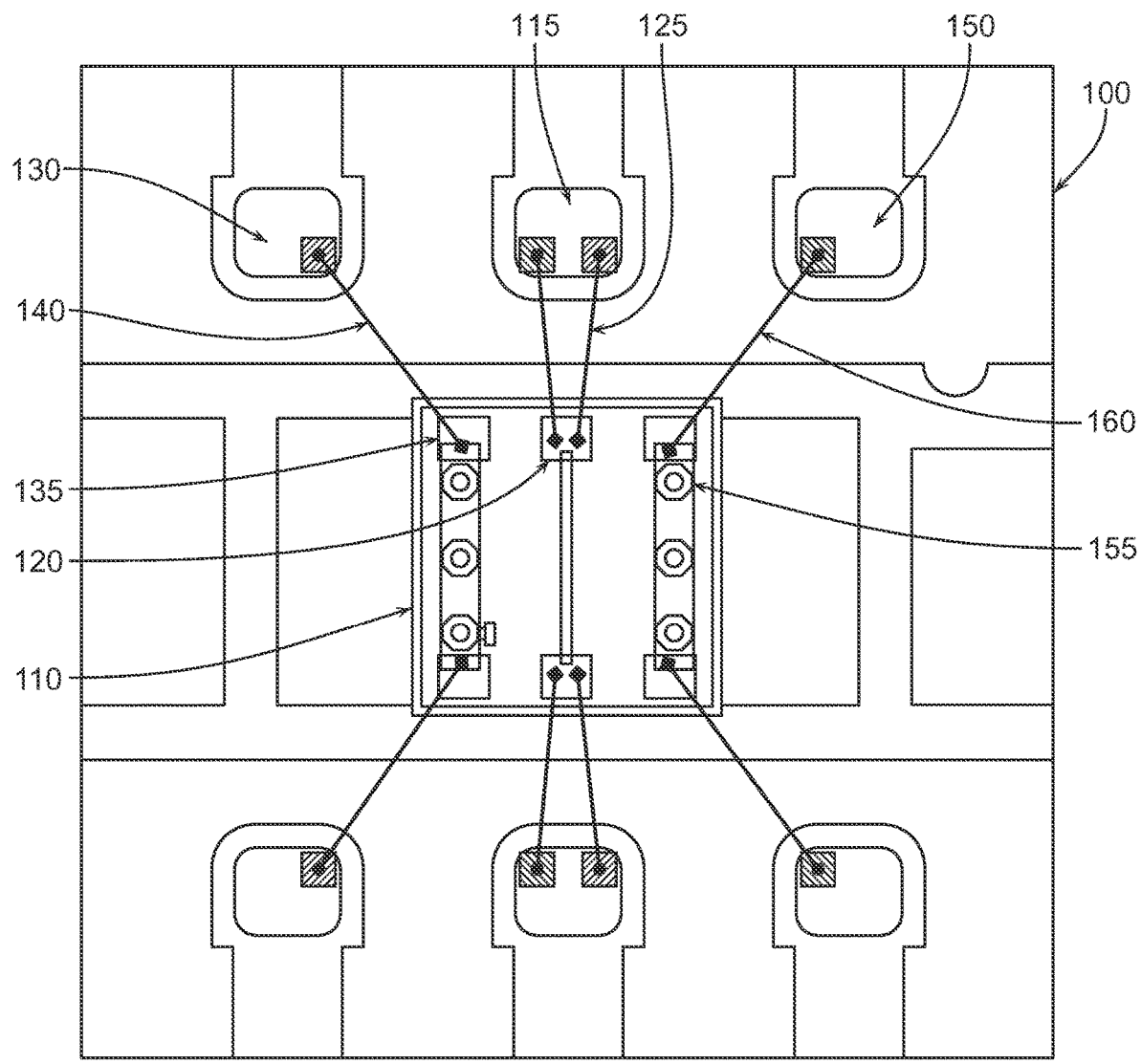
FIG. 1 depicts an exemplary diagram according to embodiments of the invention.

Embodiments of the invention are illustrated by way of example and not limitation in the figures of the accompanying drawings, in which like reference numerals indicate corresponding, analogous or similar elements. It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

DESCRIPTION OF EMBODIMENTS OF THE PRESENT INVENTION

In the following detailed description, numerous specific details are set forth in order to provide a thorough understanding of the invention. However, it will be understood by those skilled in the art that the present invention may be practiced without these specific details. In other instances, well-known methods, procedures, and components have not been described in detail so as not to obscure the present invention.

Embodiments of the invention may be used in a variety of applications. Some embodiments of the invention may be used in conjunction with various devices and systems, for example, low temperature co-fired ceramic (LTCC) devices, packaged monolithic microwave integrated circuits (MMIC), printed circuit board (PCB) manufacturing processes such as those for electronic circuits, electronic circuits, and electronic systems, or any combination thereof. Other embodiments may be used with substrates and substrate materials, lumped element electronic parts, distributed electronic parts and structures and other electronics manufacturing materials, for example epoxies, solders and other attachment materials. Embodiments of the invention may be applied to any package that may use bond wire for connection from a die pad to a package pin conductor.

Monolithic microwave integrated circuit (MMIC) may refer to electronic circuits that may be designed and/or fabricated on a common substrate, e.g., a ceramic substrate. Such electronic circuits may be comprised of one or more printed electrically conductive structures, e.g., for processing and/or acting upon an electronic signal, electronic signal energy, and the like, one or more lumped element electronic parts, e.g., capacitor, inductor, resistor, transistor, etc., or any combination thereof.

A MMIC may be unpackaged, e.g., circuits, electronic parts, etc., may be exposed to a resident environment. A MMIC may alternately be assembled into a package, e.g., a plastic material package, a ceramic material package, a hybrid material package, etc. Such a package may be sealed, e.g., hermetically sealed, to prevent and/or minimize exposure of a MMIC and its associated circuitry to an external environment. Such packages may be for enclosing high frequency components and/or circuits, including radio frequency (RF) and/or millimeter wave circuits, MMIC circuits, MMIC based products, etc.

A package for a MMIC may have electrically conductive elements transitioning between an exterior and an interior of such package. Such elements may allow for electrical signals and/or electrical signal energy to transit among an interior of such a package to an exterior of such a package. Such electrically conductive elements may be designed and/or constructed to have a matched impedance to electrical circuit attachments, either within a MMIC package or external to a MMIC package, or both.

An attachment between MMIC package transitioning elements and MMIC circuit conductive elements may be constructed using a wire bond. A wire bond may be formed by using an electrically conductive wire, e.g., a gold wire, an aluminum wire, an alloy wire, etc. Such a wire may be attached to one or more conductive elements by any of a variety of metal-to-metal attachment methods, e.g., ultrasonic bonding, wedge bonding, ball bonding, etc.

Electrically conductive elements may be used to carry and/or transit electrical signal energy through a package, e.g., a MMIC package. Such elements may additionally be used to transit electrical ground, ground signals and/or transmission line ground connections, that may be associated with transiting electrical signals. Ground connections may be made between electrical package conductive elements, e.g., a lead frame connection, and electrical ground conductive elements on or within a MMIC circuit, e.g., a bond pad, that may be enclosed by a package. There may be one or more ground connections associated with each electrical signal energy connection, e.g., an active electrical signal connection, active signal connection or active connection. A transmission line structure, e.g., a transverse electromagnetic (TEM) structure, a coaxial structure, a coplanar structure, or any other suitable structure may be used to connect electrical signal energy between a circuit external to a MMIC package and a MMIC circuit internal to such package.

Ground bond wires may be bonded directly from a bond pad to a lead frame. Such bond wires may carry RF signals, and such signal bond wires may be exposed. Being exposed, such bond wires may exhibit a parasitic inductance and/or a radiation loss.

Additional ground connection bond wires may be introduced and/or added and may cross a signal wire at mid-span of such signal wire. Mid-span of such signal wire is understood to be aligned to be at the midpoint of the physical wire length, where the precise midpoint may vary according to nominal manufacturing and alignment tolerances. It is further understood there shall be no degradation in effectiveness of the invention when such midpoint includes variations associated with locating tolerances, manufacturing tolerances, minor variations, etc.

An embodiment may have optimal performance when a crossing ground wire crosses an active wire at a middle of an active connection, a middle of a ground connection, or both. Such optimal performance my additionally occur when a point of crossing deviates from a midpoint of an active wire. Once an optimal crossing point may be determined, for example at a midpoint of a wire, or at another optimal point of a wire to be crossed, it may be repeated during subsequent manufacturing of the invention, and such repetition may include spatial deviations associated with normal manufacturing tolerances. Crossing points that may be other than a midpoint crossing found to be in accordance with an embodiment of the invention may be found by design, empirically, or by other methods. Any suitable crossing point that produces improvements in impedance matching, reduction in parasitic effects and/or reduction in signal energy radiation may be alternate embodiments of the invention.

By grounding wires crossing such signal wires, a grounded encapsulation effect may be created, and may surround one or more signal bond wires, and may transform such one or more signal bond wires from a parasitic inductor, or other undesirable parasitic effect, into a transmission line. Such transmission line may be low or be well matched such as to exhibit low reverse signal reflectivity, e.g., low voltage standing weave ratio (VSWR). Such transmission line may improve a frequency response of a package, where a frequency response may be achievement of a desired reduction in losses at one or more frequencies in an operating frequency band. A frequency response may be an amplitude, a phase and/or a combination of both, change as a frequency is changed within an operating frequency band, and may represent a dependency of a circuit on reactive, mismatch, or other, parasitic effects.

An embodiment of the invention comprises using such wire bond connections and such crossing ground wire bond connections to create an attachment from an interior conductive transfer pad of a package to a conductive pad of an encapsulated MMIC device. By using such wire attachments and such ground wire attachments, such a package exhibits an improved frequency response. Improvements in frequency responses greatly improve the utility and usefulness of MMIC devices enclosed in such packages.

Figure 3:
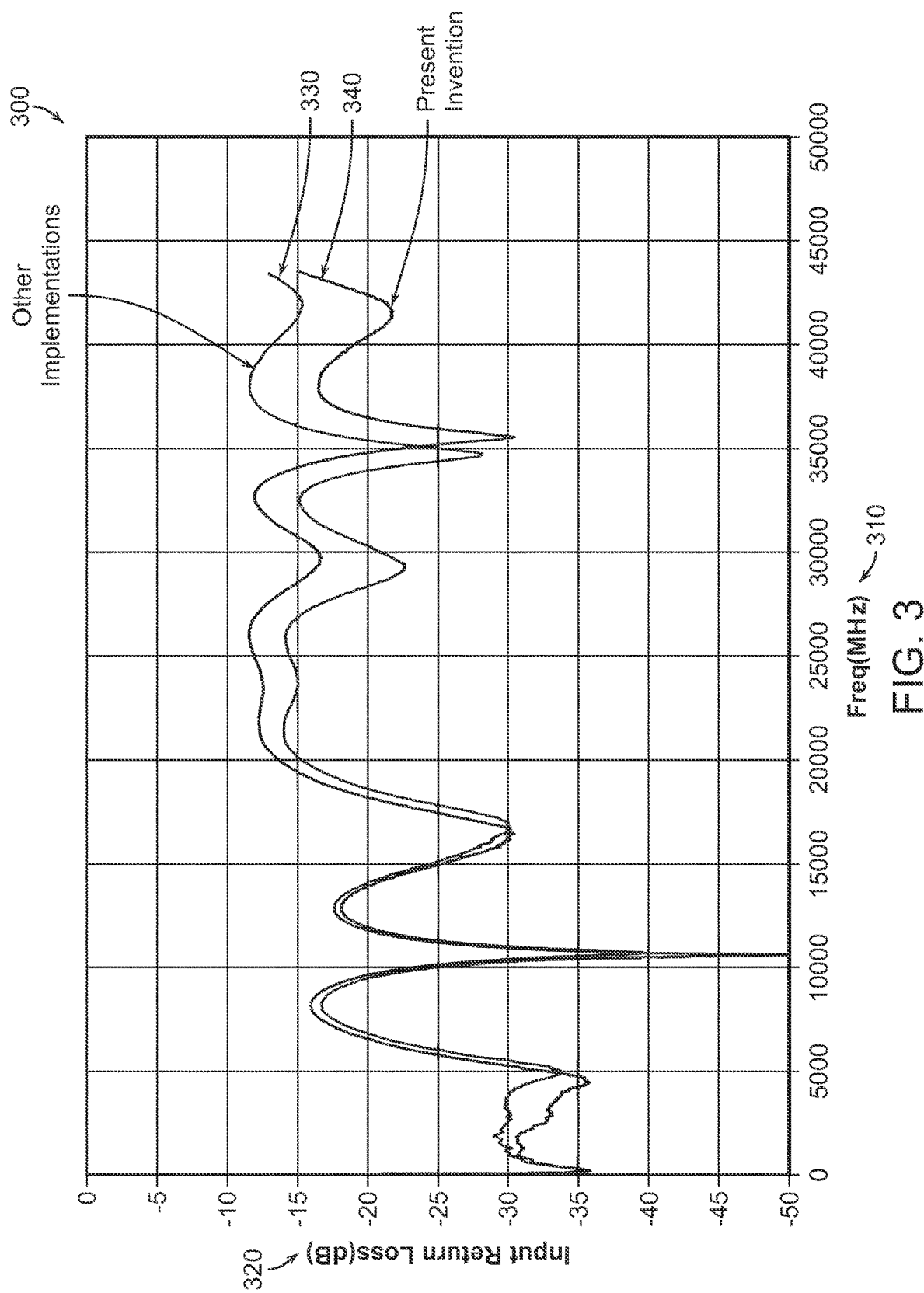
FIG. 3 depicts an exemplary diagram according to embodiments of the invention.

An embodiment of the invention may produce measured results, such as those depicted by exemplary FIG. 3. A measured device may be a transmission line MMIC. An embodiment may be measured by any suitable measurement technique, e.g., excitation and response measurement provided by a vector network analyzer, or other suitable electronic test instrument. At excitation frequencies both above and below, for example, 35 GHz, improved frequency responses may be observed. Improvements in a frequency response may occur at one or more additional frequencies, across one or more frequency bands and/or bandwidths, or throughout other measurement excitation parameters.

Geometric shapes of electrical conductors that may transit a package may have effects on an amount of electrical signal energy that may enter such a package transitions, and may be relative to an amount of electrical signal energy that may be reflected back from an interface or connection into such package. The lower the reflected energy and the greater the transmission energy, the more desirable the transition properties, geometry, etc., e.g., the lower the VSWR of such an interface. A same effect may occur for electrical conductors on a MMIC circuit, for example a MMIC circuit encapsulated, fully or partially, by such a package.

A VSWR of an interface may be reduced by altering a geometry, e.g., two-dimensional geometry, three-dimensional geometry, etc., of such conductors, such that an improvement of an electrical impedance match may be achieved. Such improved electrical impedance match may be for one or more frequencies, for example in an operating frequency band.

Another embodiment of the invention may be an electrical connection between a MMIC ground pad and a package ground pad where there may be as few as a single ground bond wire crossing an active connection. In such an embodiment there may be a single ground pad on a crossing side of one or more active pads. There may be one ground pad on one side of an active pad, e.g., a beginning side of a wire connection, and one ground pad on an opposite side of another active pad, e.g., an ending side of a wire connection, such that when the ground pads are attached by a wire connection, a connecting wire crosses an active path, e.g., an active path connection. Such a configuration may be with a single ground pad on a package side connected to a single ground pad on a MMIC side, a single ground pad on a package side connected to one of two or more ground pads on a MMIC side, or a single ground pad on a MMIC side connected to one of two or more ground pads on a package side.

An active signal wire may be of one or more lengths, and a ground connection wire may be of one or more lengths. Some embodiments may have a shortest possible length where an electrical and/or mechanical connection may be made. Other embodiments may have a length that may be a shortest possible length plus some small additional length, for example for mechanical stress relief, e.g., for allowance of expansion and/or contraction due to changes in a temperature of a wire.

Embodiments of the invention may include wires of any of a number of lengths, and a length of a wire may be unrestricted, where a wire may be a short length, a shortest length to make a connection, a longer length, or any combination of such lengths. An impedance of any wire may be electrically transformed to a matching impedance, where losses may be reduced, there may be lower parasitic inductance and/or impedance, or any combination of these effects. A ground wire may form part of an impedance transformer circuit.

Embodiments of the invention may be where one or more ground wires cross one or more active electrical signal wires at a height vertically above such signal wire, for example when a MMIC circuit is positioned such that an electrical circuit is attached to a top side of such MMIC. In such crossing, a ground wire may not be in contact with an active signal wire, and there may be a distance vertically between them, at such position of crossing. A distance may be not too low as to cause a low impedance, an undesired capacitance, and/or other undesired electrical effects. A distance may not be too high so as to not have a significant improvement, according to embodiments of the invention.

An electrical potential of a ground wire may be the same as an electrical potential of another ground wire. In embodiments where an electrical potential of a ground wire is the same, or essentially the same, as an electrical potential of another ground wire, such two ground wires may be in contact with each other. Some embodiments are constructed with two or more ground wires having no contact with each other, and other embodiments are constructed with two or more ground wires electrically contacting each other. In all such configurations, benefits of embodiments of the invention are realized.

Construction according to embodiments of the invention may be used in a variety of applications and a variety of electrical circuits. An electrical frequency of operation of devices according to embodiments of the invention may extend from very low frequencies, e.g., below 100 MHz, to very high frequencies, e.g., 50 GHz, or higher. Some devices according to embodiments may be constructed to operate over very large frequency bands, e.g., octave bandwidths, decade bandwidths, multi-decade bandwidths, etc. Other devices according to embodiments may be constructed to operate over narrow bandwidths, e.g., less than an octave bandwidth. Devices according to embodiments may perform a variety of functions, for example RF signal processing functions, gain functions, power distribution functions, gain equalizer functions, fixed attenuation functions, or any combination of functions.

In some embodiments, an electrical connection may not be directly possible from a circuit constructed, for example on a microstrip substrate, to a circuit constructed on, for example a bare semiconductor die. An electrical connection may be made by attaching a conductive bond wire, a conductive ribbon, and/or another conductive transmission medium between such microstrip circuit and such die circuit. Reference to a wire bond, conductive wire bond, electrically conductive attachment, conductive ribbon, or any such electrically conductive transmission attachment element may be used alternately herein, and are understood to mean any of such and/or similar elements, and may be used in any combination, according to embodiments of the invention. Electrical connections may be constructed to form constant impedance connections, e.g., 50 ohm impedance connections, or any other suitable impedance connections as may be necessitated by a circuit on a substrate within a package, according to other embodiments of the invention. For example, a 50 ohm connection may be made between a die, a low temperature co-fired ceramic (LTCC) substrate or package and/or a soft substrate.

FIG. 1 depicts an exemplary embodiment of the invention. Package 100 may be a package to contain an electrical circuit, a lead frame, or any other electronic circuit package. Package 100 may be constructed to be assembled onto a printed circuit board (PCB), for example by a surface-mount assembly process, or any other suitable attachment process. Package 100 may have a plurality of electrically conductive electrical signal attachment points 115, 130, 150, or terminals, that may allow transfer of electrical signal energy between an interior and an exterior of package 100. Such transfer of electrical signal energy may maintain a predetermined electrical impedance between electrically conductive attachment points at the interior and the exterior of package 100. Package 100 may be used where a circuit contained within package 100 may not be compatible with an attachment or other manufacturing process for assembly, e.g., solder reflow onto a PCB, and such circuit may require environmental protection during construction, operation, or both. Two ground points 130, 150 are depicted, and any number of one or more ground connection points may be used in embodiments of the invention.

Substrate 110 may be constructed to contain an electrical circuit, where such electrical circuit may be located on a top surface of substrate 110. Substrate 110 may be a low temperature co-fired ceramic (LTCC) substrate, a ceramic substrate, other hard substrate material, soft substrate material or any other substrate operably containing an electrical circuit. Substrate 110 may have an electrical circuit constructed on it prior to installation into package 100, after installation into package 100, or any combination of order of construction. Substrate 110 may be a packaged circuit, and such package may be incompatible with a manufacturing process for assembly of package 100 to another PCB.

Substrate 100 may have a plurality of electrically conductive electrical signal attachment points 120, 135, 155, or terminals, that may allow transfer of electrical signal energy from sources and/or loads external to substrate 100 in and/or out of a circuit contained on or within substrate 100. Attachment points 120 may carry active electrical signals, e.g., alternating current electrical signals, electrical bias signals, electrical control signals, etc. Attachment points 135, 155 may carry electrical ground signals. Such electrical ground signals may be used to maintain impedance of active electrical signals, and may be connected to a ground plane of a transmission line. Two ground points 135, 155 are depicted, and any number of one or more ground connection points may be used in embodiments of the invention.

Electrical connections 125, 140, 160 may be made between package 100 electrically conductive points 115, 130, 150 and substrate 110 electrically conductive points 120, 135, 155. Electrical connections 125, 140, 160 may be made by wires, bond wires, e.g., gold bond wires, conductive ribbons, e.g., gold ribbons, or any other electrically conductive extending structure. Electrical connections 125, 140, 160 may be comprised of one or more wires, each connecting between common points. One end of electrical connections 125, 140, 160 may be attached to electrically conductive points 115, 130, 150 on package 100 and another end may be attached to electrically conductive points 120, 135, 155 on substrate 110. Attachment may be by wire bonding, ultrasonic bonding, epoxy attachment, or any other suitable mechanical attachment method. A length of electrical connections 125, 140, 160 may be of any suitable length. A length may be long enough such that mechanical stresses or movement may have sufficient slack to prevent breakage from expansion stress or other stress. A length may short enough to maintain functionality of providing ground plane continuity of ground connections 140, 160 as a transmission line structure associated with active electrical signal energy connection 125. Two ground connections 140, 160 are depicted, and any number of one or more ground connections may be used in embodiments of the invention. Electrical attachments and/or connections may be made by mechanical attachment methods where electrical continuity is maintained.

Figure 2:
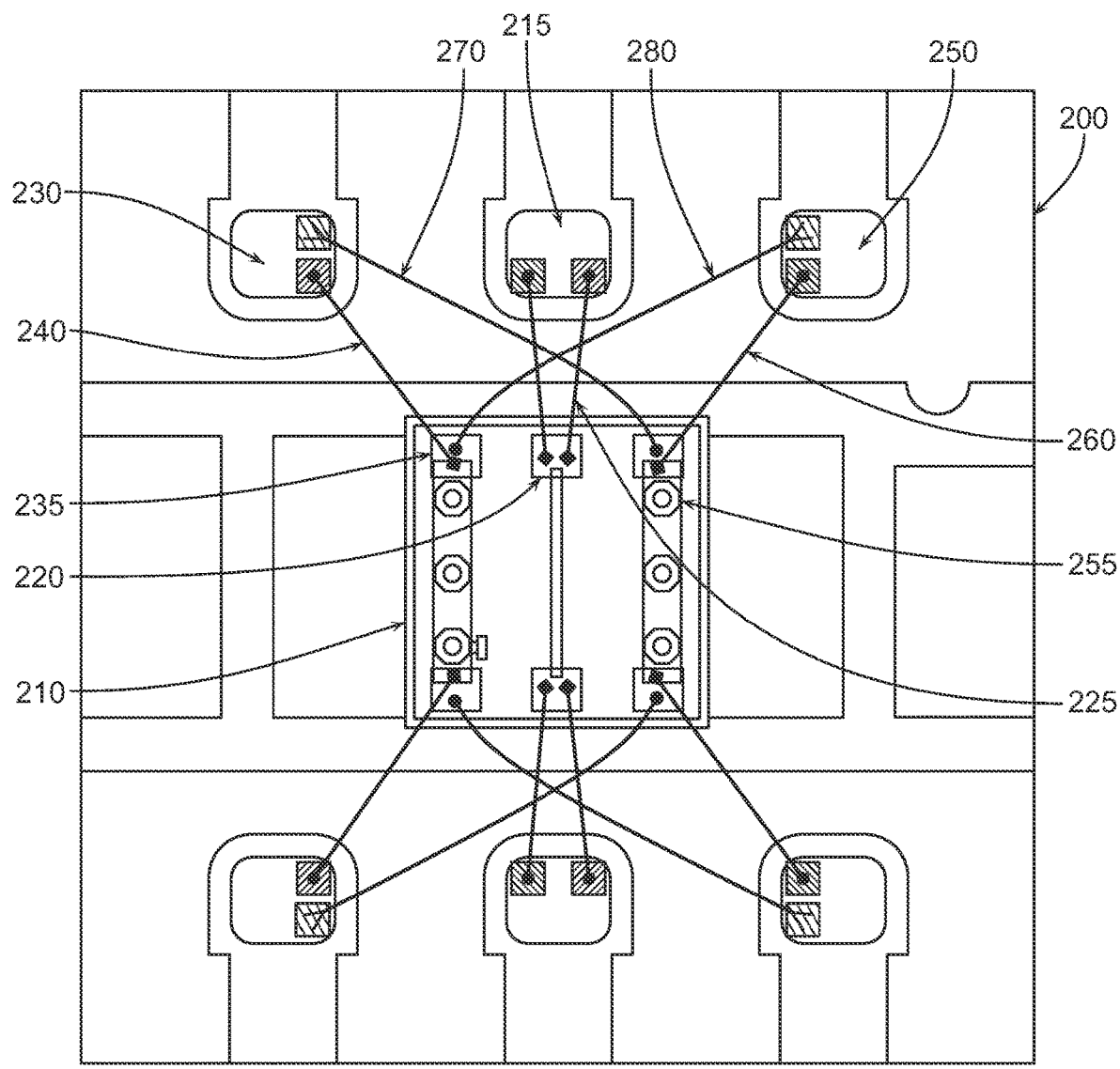
FIG. 2 depicts an exemplary diagram according to embodiments of the invention.

FIG. 2 depicts an exemplary embodiment of the invention. Package 200 and electrical attachment points 215, 230, 250, and substrate 210 and electrical attachment points 220, 235, 255 are as described according to analogous representations of FIG. 1. Electrical attachment 225 may carry connecting an active electrical signal of an alternating current, may be via a pre-defined electrical impedance and may be between an electrical signal terminal point 220 of substrate 210 to an electrical signal terminal point 215 on the interior of package 200. Electrical attachment 240 may carry a ground current that may maintain a pre-defined electrical impedance, connecting ground terminal point 235 of a substrate to ground terminal point 230 on the interior of package 200. Electrical attachment 260 may carry a ground current that may maintain a pre-defined electrical impedance, connecting ground terminal point 255 of a substrate to ground terminal point 250 on the interior of package 200. Electrical attachment 240 and/or electrical attachment 260 may each be geometrically parallel, or substantially geometrically parallel, to electrical attachment 225, and either electrical attachment 240, electrical attachment 260, or both, may be used in an embodiment. Attachment of geometrically parallel, or substantially geometrically parallel, is understood to be any geometrical attachment where such electrical ground connection remains on a same side of active electrical connection 225 and makes an electrical connection as to operably maintain ground plane continuity, for example as a ground plane of a transmission line, transmission line structure, or any similarly electrically operable structure.

Electrical attachment 270 is electrically connected between package 200 ground terminal point 230 and substrate 210 ground terminal point 255. Electrical attachment 270 may carry a ground current, for example that may maintain a pre-defined electrical impedance, and makes a non-contact geometrical crossing of active electrical wire 225. Electrical attachment 270 may be located vertically above active wire 225, or any other location where a ground continuity may be maintained by connection of wire 270. Electrical attachment 270 may be used in conjunction with, or in place of, electrical connection 240, electrical connection 260 and/or electrical connection 280.

Electrical attachment 280 is electrically connected between package 200 ground terminal point 250 and substrate 210 ground terminal point 235. Electrical attachment 280 may carry a ground current, for example that may maintain a pre-defined electrical impedance, and makes a non-contact geometrical crossing of active electrical wire 225. Electrical attachment 280 may be located vertically above active wire 225, or any other location where a ground continuity may be maintained by connection of wire 280. Electrical attachment 280 may be used in conjunction with, or in place of, electrical connection 240, electrical connection 260 and/or electrical connection 270.

The addition of electrical ground connection 270 and/or electrical ground connection 280 provides substantial improvement to transmission line and/or impedance properties of the electrical connections. Many benefits may be realized, including reduction of reflected signals and reflection signal loss, reduction of transmission insertion loss, and other electrical RF signal improvement.

An exemplary performance characterization 300 is depicted by FIG. 3. A device constructed according to an embodiment, for example as depicted by FIG. 2, was characterized according to the depicted performance of input return loss 320 versus frequency 310, over an operating frequency band 310, for example of DC (0 Hz) to greater than 45 GHz. Higher frequencies, e.g., greater than 35 GHz, are most difficult to obtain improvement in input return loss, due to a variety of factors, for example package impedance, impedance of electrical connections among packages and internal substrates, etc. Characterized performance of an embodiment of the invention 340 clearly may show an improvement in input return loss 320 versus other implementations 330 of ground connections at frequencies greater than 35 GHz. Other frequencies may have substantially similar performance where no significant performance degradation may be observed.

Figure 4:
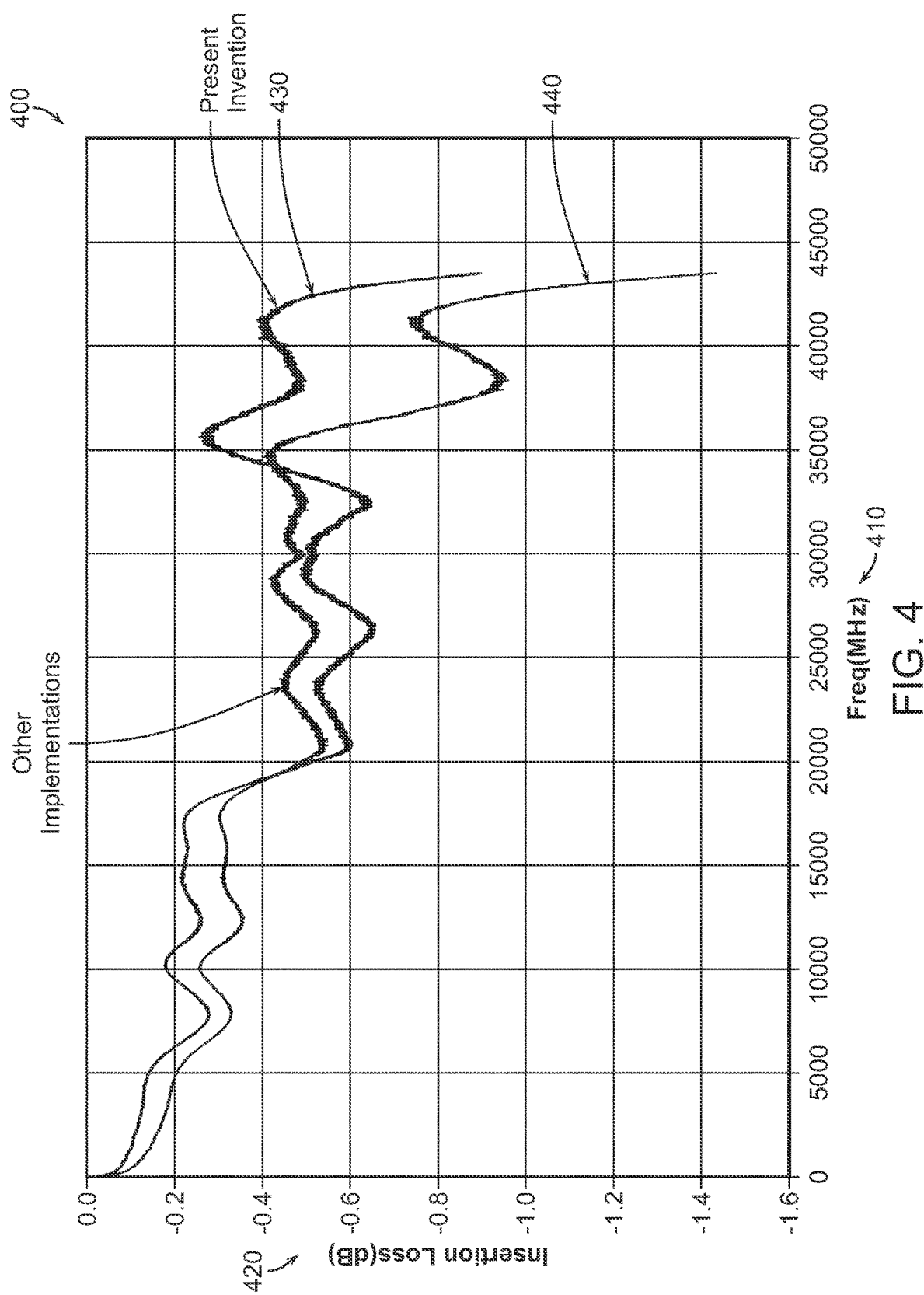
FIG. 4 depicts an exemplary diagram according to embodiments of the invention.

An exemplary performance characterization 400 is depicted by FIG. 4. A device constructed according to an embodiment, for example as depicted by FIG. 2, was characterized according to the depicted performance of insertion loss 420 versus frequency 410, over an operating frequency band 410, for example of DC (0 Hz) to greater than 40 GHz. Higher frequencies, e.g., greater than 35 GHz, are most difficult to obtain improvement in insertion loss, due to a variety of factors, for example package impedance, impedance of electrical connections among packages and internal substrates, etc. Characterized performance of an embodiment of the invention 430 clearly may show an improvement in insertion loss 420 versus other implementations 440 of ground connections at frequencies greater than 35 GHz. Other frequencies may have substantially similar performance where no significant performance degradation may be observed.

Figure 5:
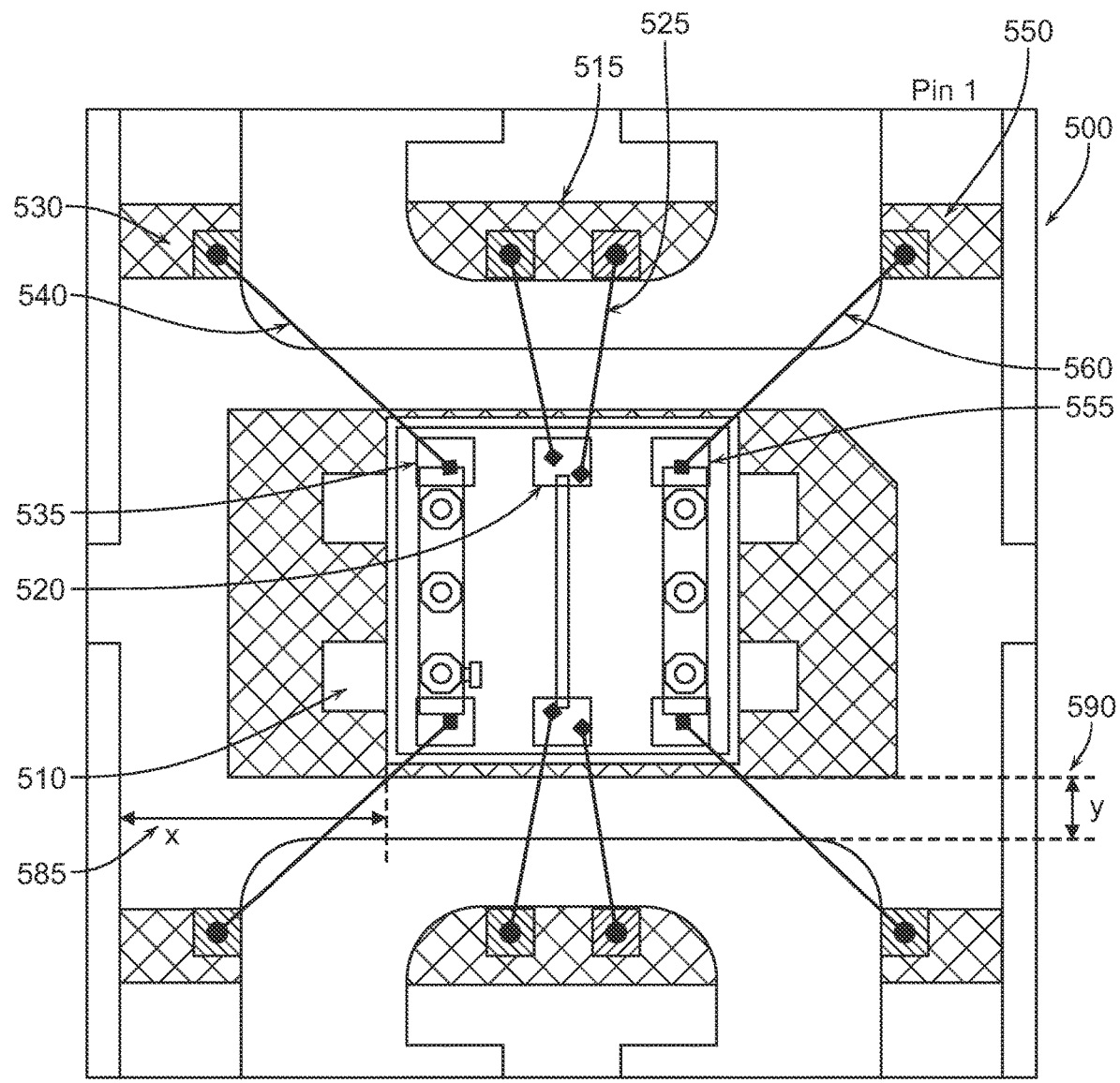
FIG. 5 depicts an exemplary diagram according to embodiments of the invention.

FIG. 5 depicts an exemplary embodiment where package 500, package electrical attachments 515, 530, 550, substrate 510, substrate electrical attachments 520, 535, 555 and electrical connections 525, 540, 560 each are similar and have similar function as analogous elements of FIG. 1. FIG. 5 depicts another configuration embodiment of installation of substrate 510 into package 500. Vertical alignment dimension 590 and/or horizontal alignment dimension 585 may be predetermined by a manufacturing process and/or a design parameter.

Figure 6:
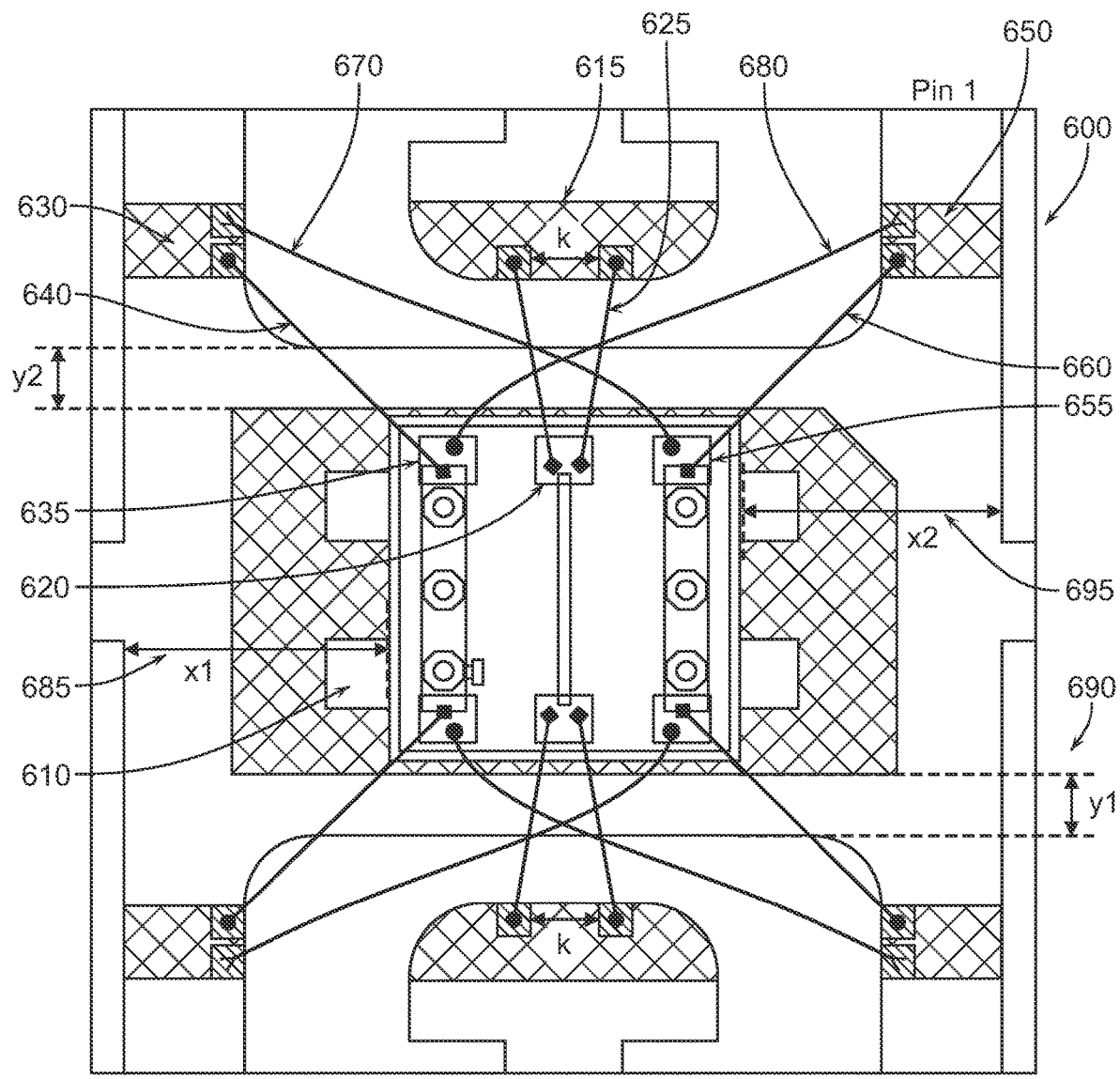
FIG. 6 depicts an exemplary diagram according to embodiments of the invention.

FIG. 6 depicts an exemplary embodiment where package 600, package electrical attachments 615, 630, 650, substrate 610, substrate electrical attachments 620, 635, 655, electrical connections 625, 640, 660 and crossover electrical attachments 670, 680 each are similar and have similar function as analogous elements of FIG. 2. FIG. 6 depicts another configuration embodiment of installation of substrate 610 into package 600. Vertical alignment dimension 690 and/or horizontal alignment dimensions 685, 695 may be predetermined by a manufacturing process and/or a design parameter.

Figure 7:
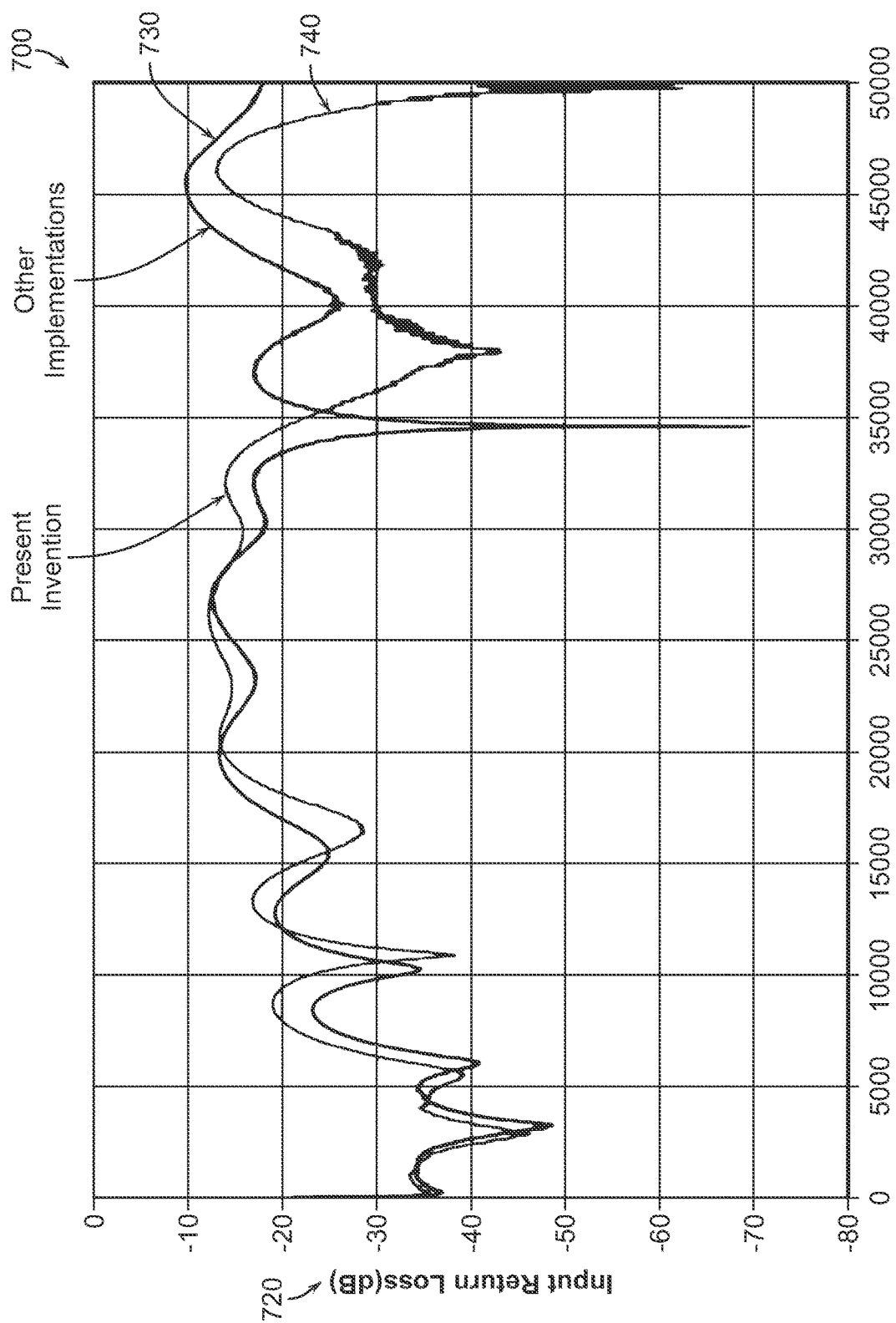
FIG. 7 depicts an exemplary diagram according to embodiments of the invention.

An exemplary performance characterization 700 is depicted by FIG. 7. A device, for example an attenuator, constructed according to an embodiment, for example as depicted by FIG. 6, was characterized according to the depicted performance of input return loss 720 versus frequency 710, over an operating frequency band 710, for example of DC (0 Hz) to 50 GHz. Higher frequencies, e.g., greater than 35 GHz, are most difficult to obtain improvement in input return loss, due to a variety of factors, for example package impedance, impedance of electrical connections among packages and internal substrates, etc. Characterized performance of an embodiment of the invention 740 clearly may show an improvement in input return loss 720 versus other implementations 730 of ground connections at frequencies greater than 35 GHz. Other frequencies may have substantially similar performance where no significant performance degradation may be observed.

Figure 8:
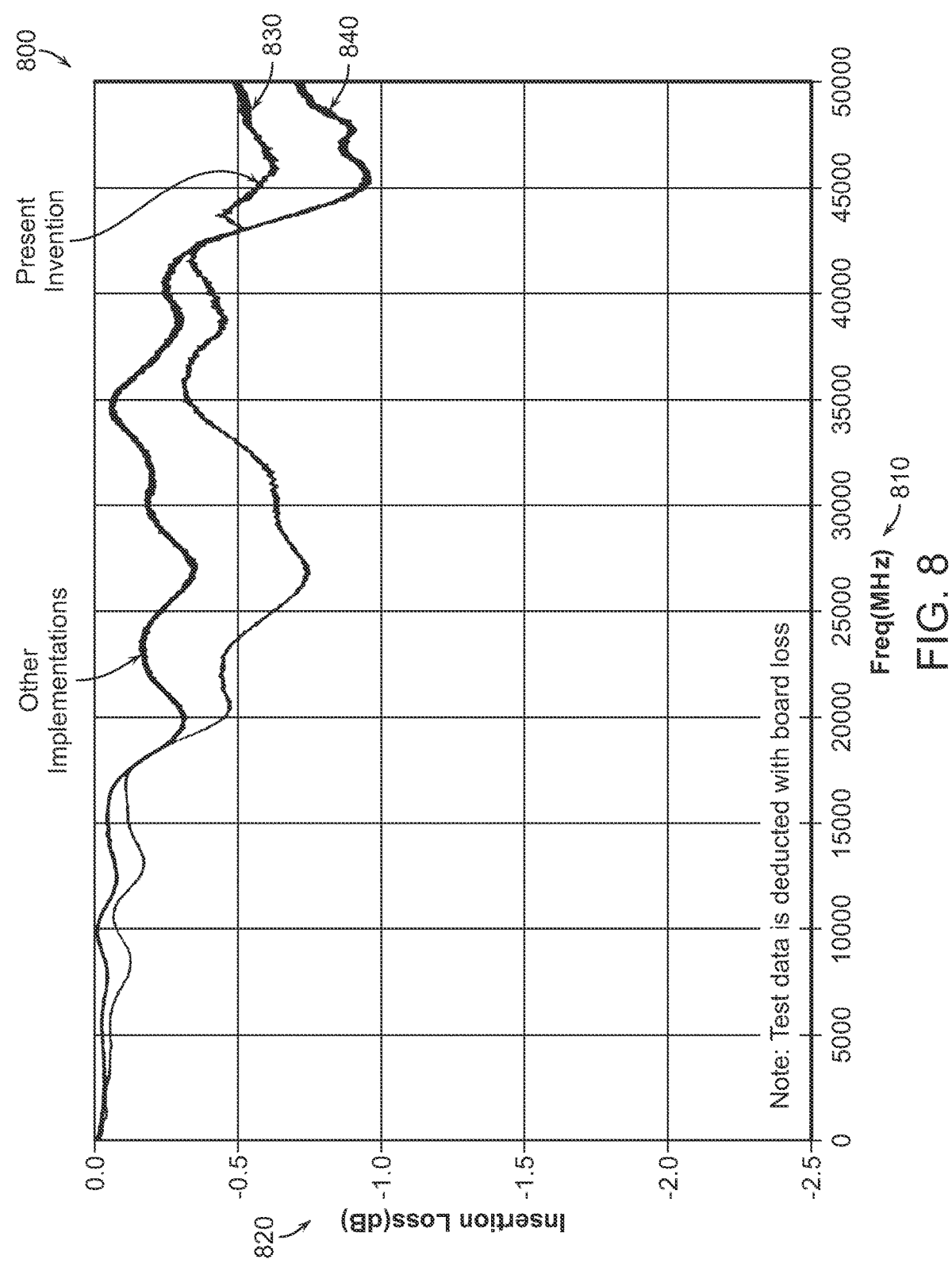
FIG. 8 depicts an exemplary diagram according to embodiments of the invention.

An exemplary performance characterization 800 is depicted by FIG. 8. A device, for example an attenuator, constructed according to an embodiment, for example as depicted by FIG. 6, was characterized according to the depicted performance of insertion loss 820 versus frequency 810, over an operating frequency band 810, for example of DC (0 Hz) to 50 GHz. Higher frequencies, e.g., greater than 35 GHz, are most difficult to obtain improvement in insertion loss, due to a variety of factors, for example package impedance, impedance of electrical connections among packages and internal substrates, etc. Characterized performance of an embodiment of the invention 830 clearly may show an improvement in insertion loss 820 versus other implementations 840 of ground connections at frequencies greater than 45 GHz. Other frequencies may have substantially similar performance where no significant performance degradation may be observed.

Figure 9:
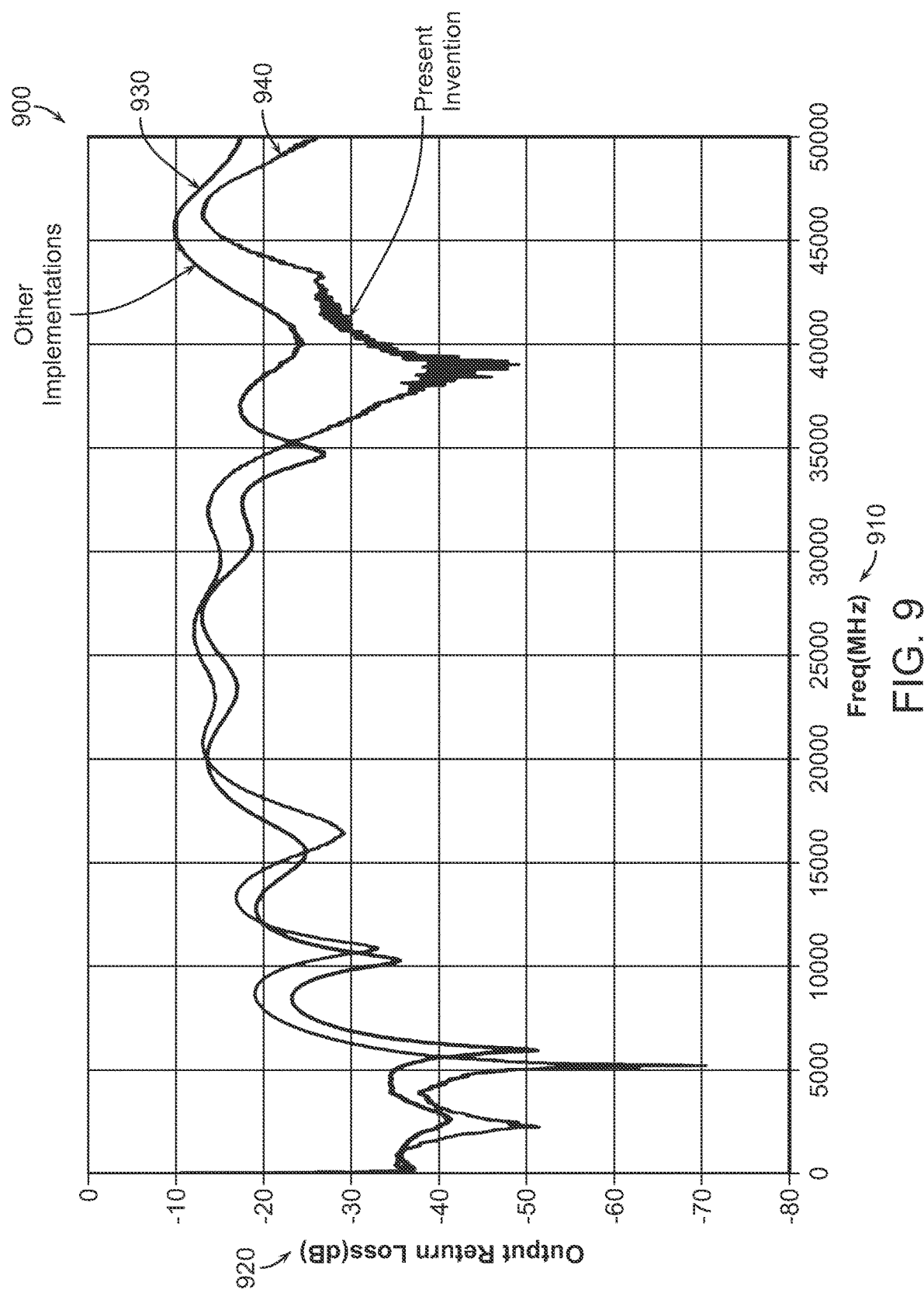
FIG. 9 depicts an exemplary diagram according to embodiments of the invention.

An exemplary performance characterization 900 is depicted by FIG. 9. A device, for example an attenuator, constructed according to an embodiment, for example as depicted by FIG. 6, was characterized according to the depicted performance of output return loss 920 versus frequency 910, over an operating frequency band 910, for example of DC (0 Hz) to 50 GHz. Higher frequencies, e.g., greater than 35 GHz, are most difficult to obtain improvement in output return loss, due to a variety of factors, for example package impedance, impedance of electrical connections among packages and internal substrates, etc. Characterized performance of an embodiment of the invention 940 clearly may show an improvement in output return loss 920 versus other implementations 930 of ground connections at frequencies greater than 35 GHz. Other frequencies may have substantially similar performance where no significant performance degradation may be observed.

Figure 10:
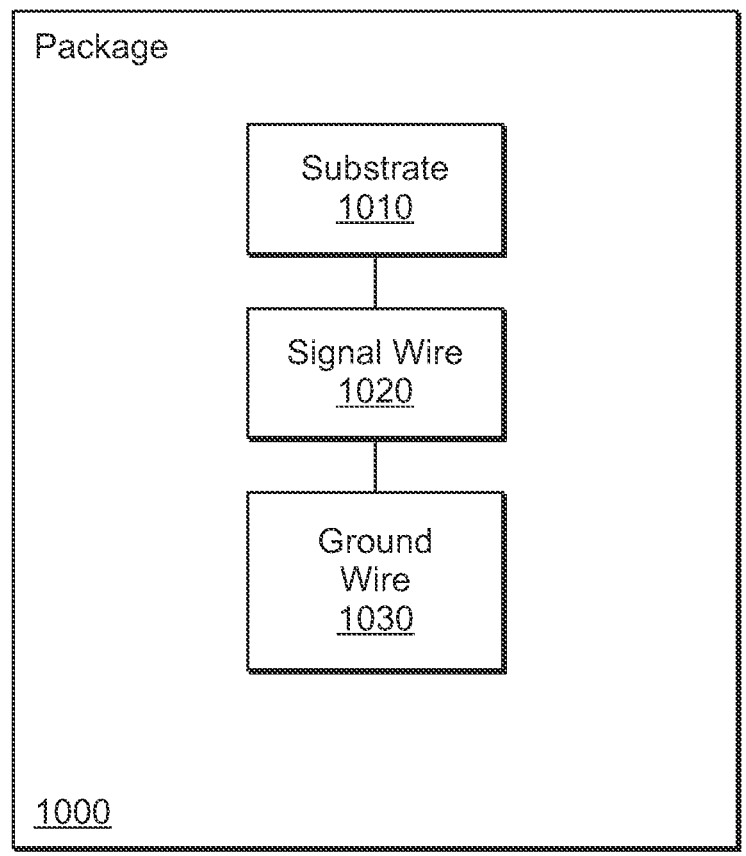
FIG. 10 depicts an exemplary diagram according to embodiments of the invention.

An exemplary diagram according to embodiments of the invention is depicted by FIG. 10. A package 1000 may have a substrate 1010 installed into its interior. Installation may be by any suitable method, e.g., epoxy attachment, eutectic attachment, etc. Such substrate 1010 may have constructed on it a passive circuit, an active circuit, or a combination of both. Substrate 1010 may also be attached into package 1000 and then have a circuit constructed onto it after being attached into package 1000. Electric signal energy conductors 1020, e.g., wires, bond wires, other electrically conductive attachment, etc., may be attached from active electrical signal conductive attachment points of substrate 1010 to package 1000. One or more such signal wires 1020 may be attached, according to varying configurations of such electrical circuit. Ground wires 1030 may be attached from ground conductive attachment points of substrate 1010 to package 1000. Such ground wires 1030 may be a single ground wire or several ground wires, and be a different number of wires for each electrical signal attachment. Ground wires 1030 may be attached by direct connection and/or may be attached by crossing over and not contacting, for example vertically above, an electrical signal wire. Elements shown by exemplary FIG. 10 may occur one or more times, and/or in one or more combinations, within an embodiment of the invention. Construction according to embodiments of the invention may achieve the performance benefits disclosed.

Figure 11:
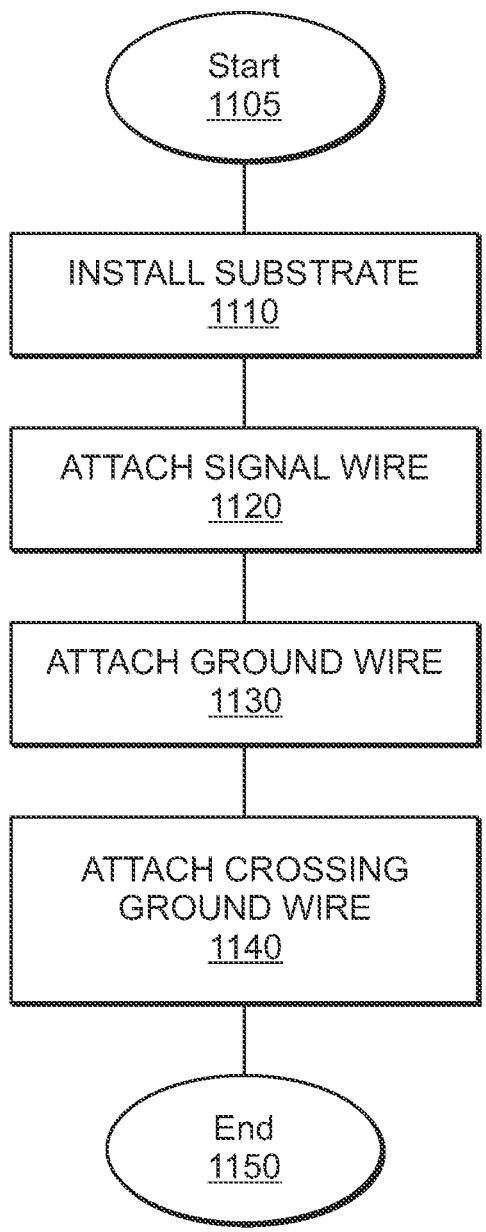
FIG. 11 depicts an exemplary method according to embodiments of the invention.

A method according to embodiments of the invention is depicted by FIG. 11. A process for creating a device according to embodiments of the invention begins 1105. A substrate is installed into a package 1110. Attachment may be by any suitable method, e.g., epoxy attachment, eutectic attachment, etc. Such substrate may have constructed on it a passive circuit, an active circuit, or a combination of both. A substrate may also be attached into a package and then have a circuit constructed onto it after being attached into a package. Electric signal energy conductors, e.g., wires, bond wires, etc., may be attached 1120 from active signal attachment points on a substrate to attachment points on the interior of a package. There may be one or more wires for each active electrical signal attachment. One or more bond wires may be attached 1130 from one or more ground conductor points on a substrate to one or more ground attachment points on a package interior. One or more wire bonds may be attached 1140 from one or more ground conductor points on a substrate to one or more ground attachment points on a package interior by crossing vertically above, and not contacting, one or more active electrical signal bond wires. Such a process may be repeated as many timed as necessary to complete all connections from a substrate to a package interior. A use of one or more wires, bond wires, etc., during a process will not restrict the use of other attachments at other points during such a process, and any may be used in any suitable combination, according to embodiments of the invention. Following connections of all wires, a package may be left unsealed, may be closed, may be sealed, or may be completed according to any other suitable manufacturing method. Construction according to embodiments of the invention may achieve the performance benefits disclosed.

Figure 12:
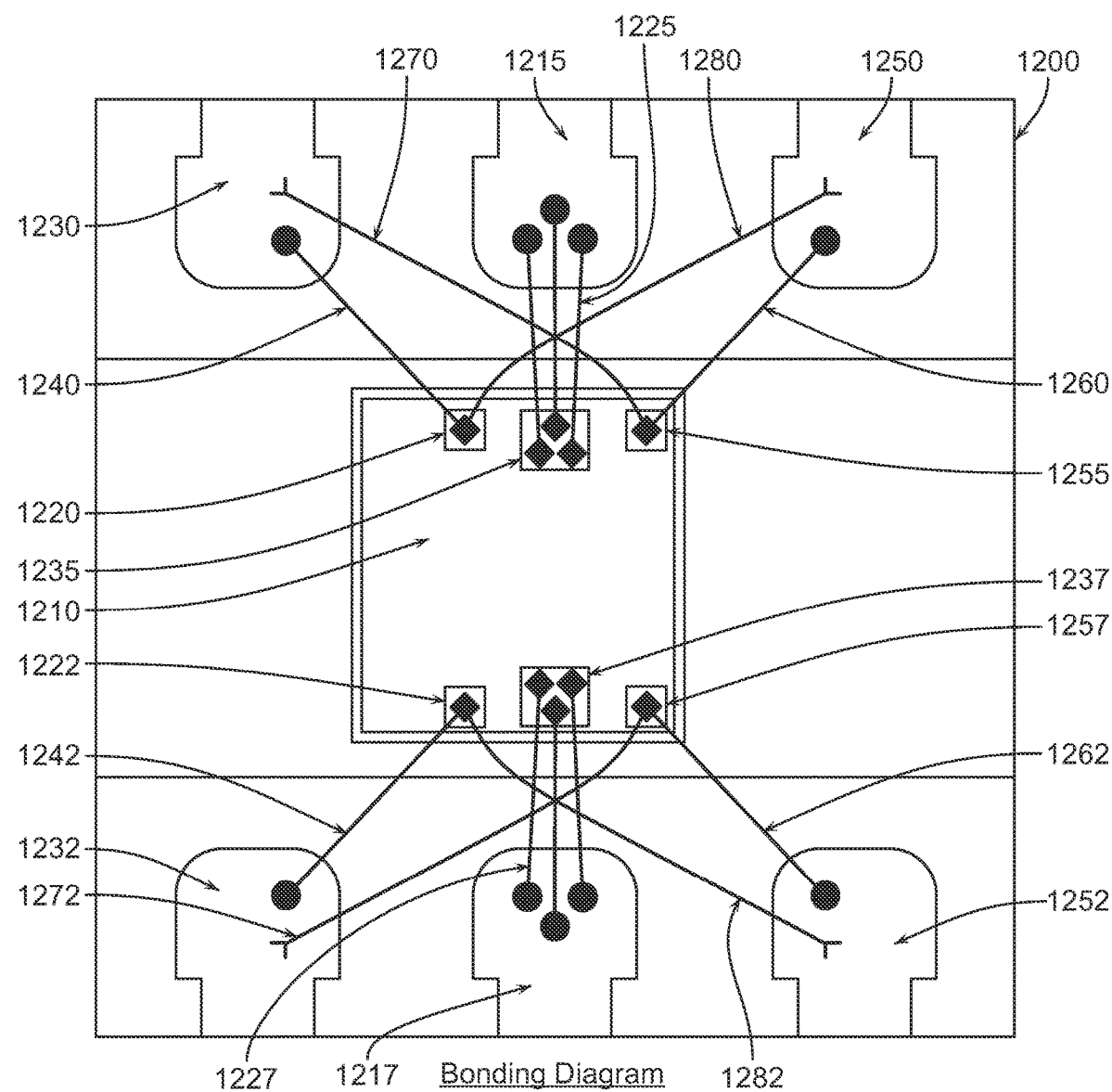
FIG. 12 depicts an exemplary diagram according to embodiments of the invention.

FIG. 12 depicts an exemplary embodiment where package 1200, package electrical attachments 1215, 1230, 1250, substrate 1210, substrate electrical attachments 1220, 1235, 1255, electrical connections 1225, 1240, 1260 and crossover electrical attachments 1270, 1280 each are similar and have similar function as analogous elements of FIG. 2. FIG. 12 depicts an embodiment of a configuration of installation of substrate 1210 into package 1200. An installation process, alignment of substrate 1210 onto and/or within package 1200 may be predetermined by a manufacturing process and/or a design parameter. Package electrical attachments 1217, 1232, 1252 are analogous to package attachments 1215, 1230, 1250, and may be used in conjunction with an electrical signal output from an electrical circuit that may be located on and/or within substrate 1210. Substrate electrical attachments 1222, 1237, 1257 are analogous to substrate electrical attachments 1220, 1235, 1255, and may be used in conjunction with an electrical signal output from an electrical circuit that may be located on and/or within substrate 1210. Electrical connections 1227, 1242, 1262 and crossover electrical attachments 1272, 1282 each are similar and have similar function as analogous elements electrical connections 1225, 1240, 1260, and may be used in conjunction with an electrical signal output from an electrical circuit that may be located on and/or within substrate 1210. Depictions may be shown relative to an input electrical signal and/or an output electrical signal, and may be indicated for illustrative purposes, for example as a directional and/or distinguishing reference. It may be understood that electrical signals may transfer either or both into and/or out of an electrical connection, signal port or other circuit point. Embodiments of the invention may be constructed at or in conjunction with electrical signal ports, device ports, and the like, that may be indicated as an exemplary designation of input, output, or another designation, and may be for descriptive reference. Any electrical connection, whether designated as input, output or another designation or descriptive label, utilizing embodiments of the invention is understood to be within the scope of the invention.

FIG. 12 may be referred to as a bonding diagram, assembly diagram, configuration diagram, installation diagram, wiring diagram, attachment diagram or any other descriptive name of an embodiment of attachment of substrate 1210 and package 1200. An exemplary diagram as depicted by FIG. 12 may include a depiction of one or more electrical connections as indicated, may include a subset of such electrical connections and/or may depict other electrical connections, mechanical connections, attachment process information, relative geometrical and/or spatial positioning information of any depicted elements, additional electrical and/or mechanical detail of any depicted elements and/or other information that may be shown for clarity.

Figure 13:
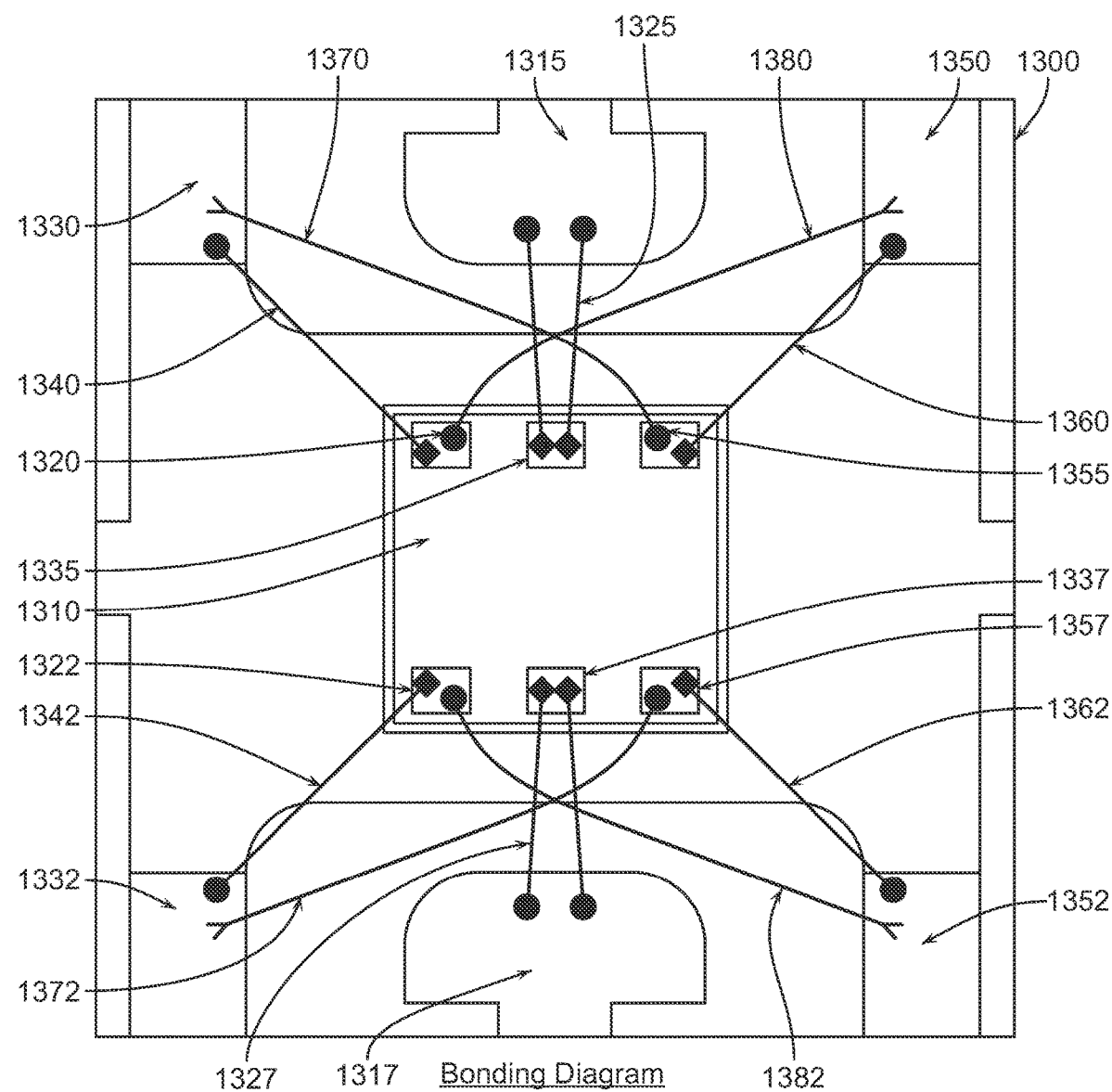
FIG. 13 depicts an exemplary diagram according to embodiments of the invention.

FIG. 13 depicts an exemplary embodiment where package 1300, package electrical attachments 1315, 1330, 1350, substrate 1310, substrate electrical attachments 1320, 1335, 1355, electrical connections 1325, 1340, 1360 and crossover electrical attachments 1370, 1380 each are similar and have similar function as analogous elements of FIG. 12. FIG. 13 depicts an embodiment of a configuration of installation of substrate 1310 into package 1300. An installation process, alignment of substrate 1310 onto and/or within package 1300 may be predetermined by a manufacturing process and/or a design parameter. Package electrical attachments 1317, 1332, 1352 are analogous to package attachments 1315, 1330, 1350, and may be used in conjunction with an electrical signal output from an electrical circuit that may be located on and/or within substrate 1310. Substrate electrical attachments 1322, 1337, 1357 are analogous to substrate electrical attachments 1320, 1335, 1355, and may be used in conjunction with an electrical signal output from an electrical circuit that may be located on and/or within substrate 1310. Electrical connections 1327, 1342, 1362 and crossover electrical attachments 1372, 1382 each are similar and have similar function as analogous elements electrical connections 1325, 1340, 1360, and may be used in conjunction with an electrical signal output from an electrical circuit that may be located on and/or within substrate 1310. Depictions may be shown relative to an input electrical signal and/or an output electrical signal, and may be indicated for illustrative purposes, for example as a directional and/or distinguishing reference. It may be understood that electrical signals may transfer either or both into and/or out of an electrical connection, signal port or other circuit point. Embodiments of the invention may be constructed at or in conjunction with electrical signal ports, device ports, and the like, that may be indicated as an exemplary designation of input, output, or another designation, and may be for descriptive reference. Any electrical connection, whether designated as input, output or another designation or descriptive label, utilizing embodiments of the invention is understood to be within the scope of the invention.

FIG. 13 may be referred to as a bonding diagram, assembly diagram, configuration diagram, installation diagram, wiring diagram, attachment diagram or any other descriptive name of an embodiment of attachment of substrate 1310 and package 1300. An exemplary diagram as depicted by FIG. 13 may include a depiction of one or more electrical connections as indicated, may include a subset of such electrical connections and/or may depict other electrical connections, mechanical connections, attachment process information, relative geometrical and/or spatial positioning information of any depicted elements, additional electrical and/or mechanical detail of any depicted elements and/or other information that may be shown for clarity.

Figure 14:
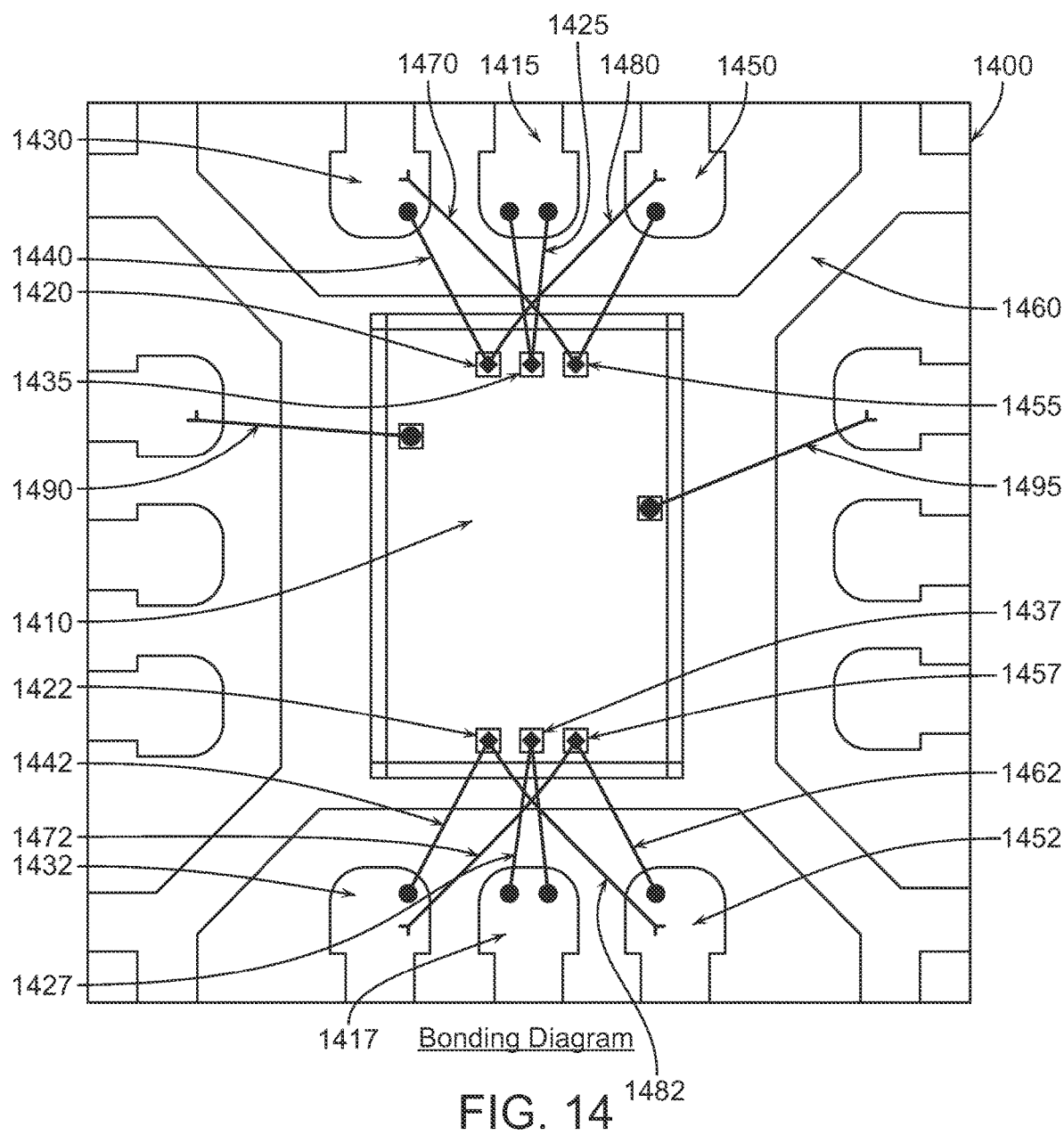
FIG. 14 depicts an exemplary diagram according to embodiments of the invention.

FIG. 14 depicts an exemplary embodiment where package 1400, package electrical attachments 1415, 1430, 1450, substrate 1410, substrate electrical attachments 1420, 1435, 1455, electrical connections 1425, 1440, 1460 and crossover electrical attachments 1470, 1480 each are similar and have similar function as analogous elements of FIG. 12. FIG. 14 depicts an embodiment of a configuration of installation of substrate 1410 into package 1400. An installation process, alignment of substrate 1410 onto and/or within package 1400 may be predetermined by a manufacturing process and/or a design parameter. Package electrical attachments 1417, 1432, 1452 are analogous to package attachments 1415, 1430, 1450, and may be used in conjunction with an electrical signal output from an electrical circuit that may be located on and/or within substrate 1410. Substrate electrical attachments 1422, 1437, 1457 are analogous to substrate electrical attachments 1420, 1435, 1455, and may be used in conjunction with an electrical signal output from an electrical circuit that may be located on and/or within substrate 1410. Electrical connections 1427, 1442, 1462 and crossover electrical attachments 1472, 1482 each are similar and have similar function as analogous elements electrical connections 1425, 1440, 1460, and may be used in conjunction with an electrical signal output from an electrical circuit that may be located on and/or within substrate 1410. Depictions may be shown relative to an input electrical signal and/or an output electrical signal, and may be indicated for illustrative purposes, for example as a directional and/or distinguishing reference. It may be understood that electrical signals may transfer either or both into and/or out of an electrical connection, signal port or other circuit point. Embodiments of the invention may be constructed at or in conjunction with electrical signal ports, device ports, and the like, that may be indicated as an exemplary designation of input, output, or another designation, and may be for descriptive reference. Any electrical connection, whether designated as input, output or another designation or descriptive label, utilizing embodiments of the invention is understood to be within the scope of the invention.

FIG. 14 may be referred to as a bonding diagram, assembly diagram, configuration diagram, installation diagram, wiring diagram, attachment diagram or any other descriptive name of an embodiment of attachment of substrate 1410 and package 1400. Other electrical connections 1490, 1495 may depict voltage, power, bias or other circuit connections, and may indicate an electrical connection between an electrical contact point on package 1400 and an electrical contact point on substrate 1410. Electrical connections 1490, 1495 may be made directly without crossover connections, and may be used in conjunction with, and/or in addition to, other connections that may have crossover connections, as described herein. Electrical connections 1490, 1495 are depicted as exemplary connections, and may represent one or more electrical connections.

An exemplary diagram as depicted by FIG. 14 may include a depiction of one or more electrical connections as indicated, may include a subset of such electrical connections and/or may depict other electrical connections, mechanical connections, attachment process information, relative geometrical and/or spatial positioning information of any depicted elements, additional electrical and/or mechanical detail of any depicted elements and/or other information that may be shown for clarity.

While certain features of the invention have been illustrated and described herein, many modifications, substitutions, changes, and equivalents may occur to those skilled in the art. It is, therefore, to be understood that the appended claims are intended to cover all such modifications and changes as fall within the true spirit of the invention.

What is claimed is:

1. An apparatus comprising:
    a package for containing an electrical substrate;
    a substrate with an electrical circuit constructed thereon, pre-attached to the interior of said package;
    a first wire connecting an active electrical signal terminal point of said substrate to an electrical signal terminal point on the interior of said package, carrying an alternating current through a pre-defined electrical impedance;
    a second wire connecting a first ground terminal point of said substrate to a first ground terminal point on the interior of said package, carrying a ground current to maintain said pre-defined electrical impedance, and wherein said second wire makes a non-contact geometrical crossing of said first wire; and
    a third wire connecting said first ground terminal point of said substrate to a second ground terminal point on the interior of said package, wherein said third wire is geometrically parallel to said first wire.

2. The apparatus of claim 1, further comprising a fourth wire connecting a second ground terminal point of said substrate to said first ground terminal point on the interior of said package, wherein said fourth wire is geometrically parallel to said first wire.

3. The apparatus of claim 2, further comprising both said third wire and said fourth wire.

4. The apparatus of claim 1, further comprising a fifth wire connecting a second ground terminal point of said substrate to a second ground terminal point on the interior of said package, wherein said fifth wire makes a non-contact geometrical crossing of said first wire.

5. The apparatus of claim 1, further comprising said third wire, a fourth wire and a fifth wire.

6. The apparatus of claim 1, wherein said wires are electrically conductive ribbons.

7. The apparatus of claim 1, wherein said wires are a plurality of electrical conductors making electrical connection to each of said points.

8. The apparatus of claim 1, wherein said connecting is by mechanical attachment.

9. The apparatus of claim 8, wherein said mechanical attachment is wire bonding.

10. The apparatus of claim 1, further comprising said substrate is a monolithic microwave integrated circuit (MMIC).

11. The apparatus of claim 10, wherein said MMIC is a low temperature co-fired ceramic (LTCC).

12. The apparatus of claim 1, wherein said package fully encloses said substrate.

13. The apparatus of claim 1, wherein said electrical circuit is selected from a gain equalizer, an amplifier, a filter or an attenuator.

14. The apparatus of claim 1, wherein said pre-defined electrical impedance is 50 ohms.

15. The apparatus of claim 1, wherein said first wire passes substantially the same electrical signal energy throughout substantially all of its design passband frequencies, where said passed electrical signal energy has substantially no additional insertion loss or no additional reflected electrical signal energy from the electrical connection of said second wire.

16. The method of constructing said apparatus of claim 1.

17. An apparatus comprising:
    a package for containing an electrical substrate, including a first active electrical signal terminal point, a first ground terminal point and a second ground terminal point, each located on either side of said first active electrical signal terminal point, wherein said first ground terminal point and said second ground terminal point are associated with electrical signal conduction of said first active electrical signal terminal point;
    a substrate with an electrical circuit constructed thereon, pre-attached to the interior of said package, including a second active electrical signal terminal point adjacent to said first active electrical signal terminal point, a third ground terminal point adjacent to said first ground terminal point and a fourth ground terminal point adjacent to said second ground terminal point, wherein said third ground terminal point and said fourth ground terminal point are associated with electrical signal conduction of said second active electrical signal terminal point;
    a first electrically conductive bond wire connecting said first active electrical signal terminal point to said second active electrical signal terminal point carrying an alternating current through a pre-defined electrical impedance;
    a second electrically conductive bond wire connecting said first ground terminal point to said third ground terminal point;
    a third electrically conductive bond wire connecting said second ground terminal point to said fourth ground terminal point;
    a fourth electrically conductive bond wire connecting said first ground terminal point to said fourth ground terminal point, wherein said fourth wire makes a non-contact geometrical crossing of said first wire;
    a fifth electrically conductive bond wire connecting said second ground terminal point to said third ground terminal point, wherein said fifth wire makes a non-contact geometrical crossing of said first wire; and
    wherein said second, third, fourth and fifth wires each carry a ground current to maintain said pre-defined electrical impedance.

18. The apparatus of claim 17, wherein said alternating current is an input signal, an output signal or a bias control signal.

19. The apparatus of claim 17, further comprising both an input signal wire connection set and an output signal wire connection set, wherein said input signal wire connection set and said output signal wire connection set each are comprised of said first electrically conductive bond wire, said second electrically conductive bond wire, said third electrically conductive bond wire, said fourth electrically conductive bond wire and said fifth electrically conductive bond wire.

20. The method of constructing said apparatus of claim 17.

* * * * *